(12) United States Patent
Sakurai et al.

(10) Patent No.: US 9,703,305 B2
(45) Date of Patent: Jul. 11, 2017

(54) POWER CIRCUIT

(71) Applicants: Kohei Sakurai, Tokyo (JP); Yoichi Takano, Tokyo (JP)

(72) Inventors: Kohei Sakurai, Tokyo (JP); Yoichi Takano, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 55 days.

(21) Appl. No.: 14/975,973

(22) Filed: Dec. 21, 2015

(65) Prior Publication Data

US 2016/0197554 A1    Jul. 7, 2016

(30) Foreign Application Priority Data

Jan. 7, 2015   (JP) ................................ 2015-001585

(51) Int. Cl.
    *G05F 1/00*    (2006.01)
    *G05F 1/565*   (2006.01)
    *G05F 1/56*    (2006.01)
    *G01R 19/00*   (2006.01)

(52) U.S. Cl.
    CPC .............. *G05F 1/56* (2013.01); *G01R 19/00* (2013.01)

(58) Field of Classification Search
    CPC ... G05F 1/46; G05F 1/56; G05F 1/562; G05F 1/565; G05F 1/575
    USPC .......................... 323/266, 274, 275, 284, 285
    See application file for complete search history.

(56) References Cited

U.S. PATENT DOCUMENTS

| 6,031,364 | A | 2/2000 | Hosono et al. | |
|---|---|---|---|---|
| 2004/0113599 | A1* | 6/2004 | Kojima | G05F 1/575 323/284 |
| 2012/0126762 | A1* | 5/2012 | Takano | G05F 1/573 323/274 |
| 2013/0002220 | A1* | 1/2013 | Terada | G05F 1/56 323/282 |

FOREIGN PATENT DOCUMENTS

JP    2000-066742    3/2000

* cited by examiner

*Primary Examiner* — Adolf Berhane
*Assistant Examiner* — Gary Nash
(74) *Attorney, Agent, or Firm* — IPUSA, PLLC

(57) ABSTRACT

A power circuit includes an input terminal to which an input voltage is applied; a control element which generates an output voltage obtained by regulating the input voltage; an output terminal from which the output voltage is output; a discharge circuit which discharges by extracting an electric charge from the control element on a side of the output terminal; a drive circuit which generates a drive current for causing the discharge circuit to operate using power of the control element on the side of the input terminal; a detection circuit which detects the output voltage; and a discharge control circuit which decreases a current value of the drive current to a current value enabling the discharge circuit to continuously operate in a case where the detection circuit detects that the output voltage reaches a setup voltage by an operation of the discharge circuit.

13 Claims, 9 Drawing Sheets

POWER CIRCUIT

CROSS-REFERENCE TO RELATED APPLICATIONS

This patent application is based upon and claims the benefit of priority of Japanese Patent Application No. 2015-001585 filed on Jan. 7, 2015, the entire contents of which are incorporated herein by reference.

BACKGROUND OF THE INVENTION

1. Field of the Invention

The present invention relates to a power circuit.

2. Description of the Related Art

An example of a regulator discharges an electric charge in a capacitor connected with an output terminal in order to quickly reduce an output voltage (for example, Patent Document 1).

FIG. 1 is a circuit diagram of a regulator disclosed in Patent Document 1. A transistor Q controlling an output voltage Vo is connected between an input terminal 1 and an output terminal 2 in series. A direct-current source E1 is connected to the input terminal 1 so as to supply an input voltage Vi. A capacitor C1 is connected to the output terminal 2.

When a transistor Q1 is in a stopped state (an off state), a switch circuit 4 stops a supply of a base current from a constant current source S1 to a transistor Q2. Therefore, the transistor Q2 is turned off so as to shut off a detection circuit 6 detecting the output voltage Vo. A current flowing through resisters R1 and R2 becomes a base current of a transistor Q4, and this base current is amplified twice (is provided with a two-stage amplification) by the transistors Q4 and Q5 so as to become a base current of a transistor Q3. Then, the electric charge of the capacitor C1 is discharged by the transistor Q3. Therefore, the output voltage Vo is reduced.

[Patent Document 1] Japanese Laid-open Patent Publication No. 2000-66742

SUMMARY OF THE INVENTION

However, in the above example, even after the capacitor C1 completely discharges, the current continues to flow in a route P from the input terminal 1 through the transistor Q5 to the transistor Q3, and a consumption current increases in a discharge completion state where the discharge is completed.

Accordingly, embodiments of the present invention may provide a power circuit which reduces a consumption current in a state where a discharge on a side of an output terminal is completed.

According to a first aspect of the present invention, there is provided a power circuit including an input terminal to which an input voltage is applied; a control element which generates an output voltage obtained by regulating the input voltage; an output terminal from which the output voltage is output; a discharge circuit which discharges by extracting an electric charge from the control element on a side of the output terminal; a drive circuit which generates a drive current for causing the discharge circuit to operate using power of the control element on the side of the input terminal; a detection circuit which detects the output voltage; and a discharge control circuit which decreases a current value of the drive current to a current value enabling the discharge circuit to continuously operate in a case where the detection circuit detects that the output voltage reaches a setup voltage by an operation of the discharge circuit.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

A description of embodiments of the present invention is given below, with reference to the FIG. 1 through FIG. 10.

Figure 1:
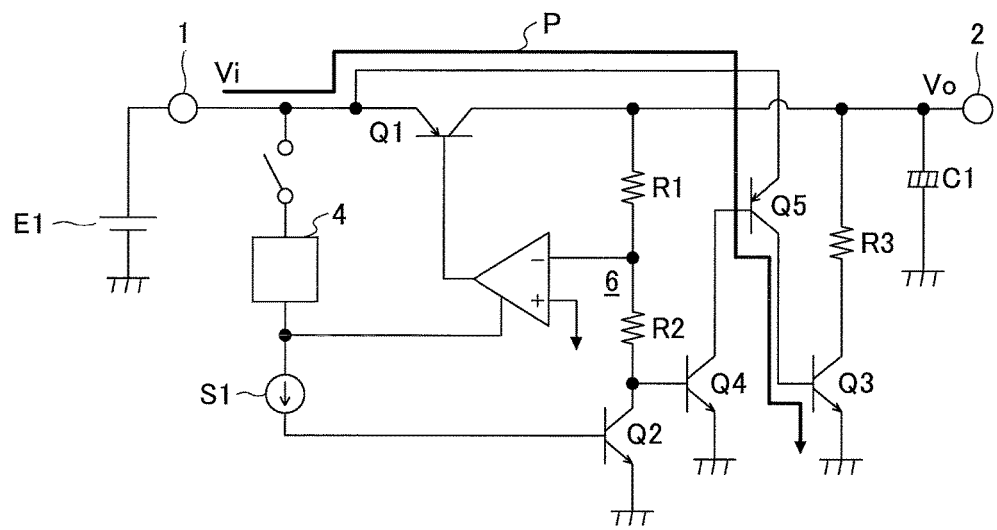
FIG. 1 illustrates an example of a regulator.
Figure 2:
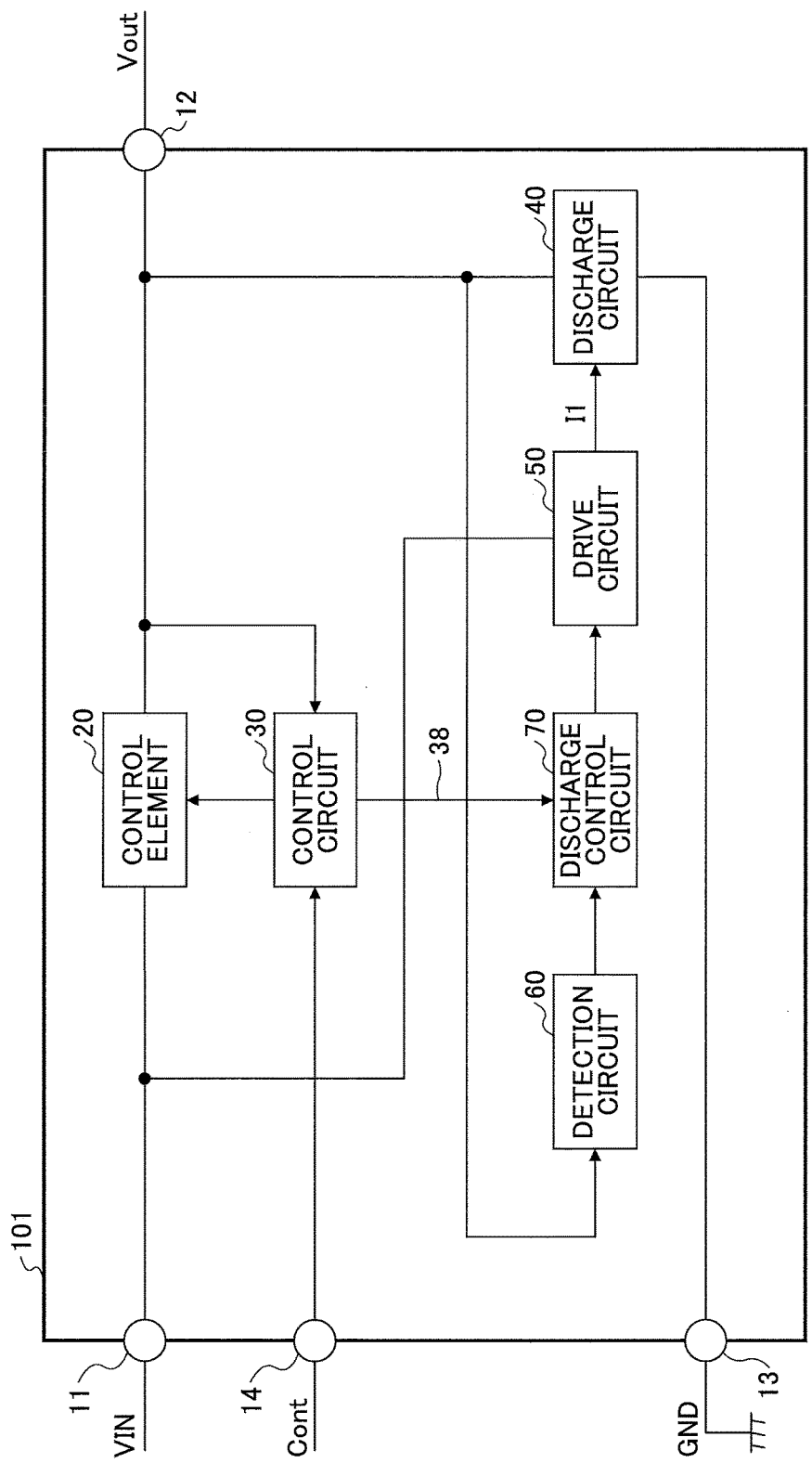
FIG. 2 is a block chart illustrating a structural example of a power circuit.

FIG. 2 is a block chart illustrating a structural example of a regulator being an embodiment of a power circuit. The regulator 101 is an example of a series regulator generating a positive direct current output voltage Vout using a control element from a positive direct current input voltage VIN. The regulator 101 is a semiconductor integrated circuit including, for example, an input terminal 11, an output terminal 12, a ground terminal 13, a control terminal 14, the control element 20, a control circuit 30, a discharge circuit 40, a drive circuit 50, a detection circuit 60, and a discharge control circuit 70.

The input terminal 11 is an example of an input terminal to which the input voltage VIN is applied. The input terminal 11 is, for example, a power input terminal, to which the positive terminal side of a direct-current power source supplying the input voltage VIN.

The output terminal 12 is an example of an output terminal outputting the output voltage Vout. The output terminal 12 is, for example, a power source output terminal connected with a load or a capacitor, to which the output voltage Vout is applied. The capacitor connected to the output terminal 12 may be provided outside the regulator 101 or inside the regulator 101.

The ground terminal 13 is an example of a ground terminal, which is connected to a ground potential and to which a ground voltage GND is applied. The ground terminal 13 is, for example, a ground terminal connected to a negative terminal side of the direct-current power source of which positive terminal side is connected to the input terminal 11.

The control terminal 14 is an example of a control terminal, to which a control signal Cont for instructing whether the control element 20 of the regulator 101 is operated is input from the outside of the regulator 101. The control signal Cont is, for example, a chip enable signal for instructing whether the state of the control element 20 of the regulator 101 is made to be an operation state or a stopped state.

The control element 20 is an example of a control element for generating the output voltage Vout obtained by regulating the input voltage VIN. The control element 20 is connected between the input terminal 11 and the output terminal 12 in series. The control element 20 steps down a positive voltage value (e.g., 5 V) of the input voltage VIN so as to be a constant positive value (e.g., 3 V) lower than the voltage value of the input voltage VIN in response to, for example, a drive signal from the control circuit 30.

The control circuit 30 is an example of a control circuit for outputting a drive signal that controls the control element 20 so as to make the voltage value of the output voltage Vout constant in response to a difference between a detection value of the output voltage Vout and a predetermined reference voltage, The control circuit 30 determines whether the control element 20 and the discharge circuit 40 are operated in response to, for example, a voltage level of the control signal Cont. When the voltage level of the control signal Cont is an active level (e.g., a high level), the control circuit 30 outputs the instruction signal 38 for causing the control element 20 to perform a regulation operation and simultaneously prohibiting the operation of the discharge circuit 40 to the discharge control circuit 70. When the voltage level of the control signal Cont is a non-active level (e.g., a low level), the control circuit 30 outputs the instruction signal 38 for causing the control element 20 to stop its operation and simultaneously permitting the operation of the discharge circuit 40 to the discharge control circuit 70.

The discharge circuit 40 is an example of a discharge circuit for extracting an electric charge on a side of the output terminal 12 of the control element 20. For example, the discharge circuit 40 discharges the electric charge in the output terminal 12 to the ground terminal 13. In a case where the capacitor connected to the output terminal 12 is disposed outside the regulator 101, the discharge circuit 40 discharges the electric charge, which is extracted from, for example, the capacitor connected to the output terminal 12 through the output terminal 12 to the ground terminal 13. As described, when the discharge circuit 40 extracts the electric charge on the side of the output terminal 12, the output voltage Vout rapidly decreases so as to approach the ground voltage GND.

The drive circuit 50 is an example of a drive circuit which generates a drive current I1 for causing the discharge circuit 40 to operate using electric power (specifically, electric power of the input voltage VIN) on the side of the input terminal 11 of the control element 20. The drive circuit 50 is operated by receiving the power of the control element 20 on the side of the input terminal 11 without being operated by receiving the power of the output terminal 12 on the side of the control element 20 so that the discharge circuit 40 is caused to be continuously operated even if the output voltage approaches the ground voltage GND by a discharge operation of the discharge circuit 40.

The detection circuit 60 is an example of a detection circuit for detecting the output voltage Vout. The detection circuit 60 is operated by receiving the power of the control element 20 on the side of the input terminal 11 without being operated by receiving the power of the output terminal 12 on the side of the control element 20 so that the detection circuit 60 is caused to continuously detect the output voltage Vout even if the output voltage approaches the ground voltage GND by a discharge operation of the discharge circuit 40.

Figure 3:
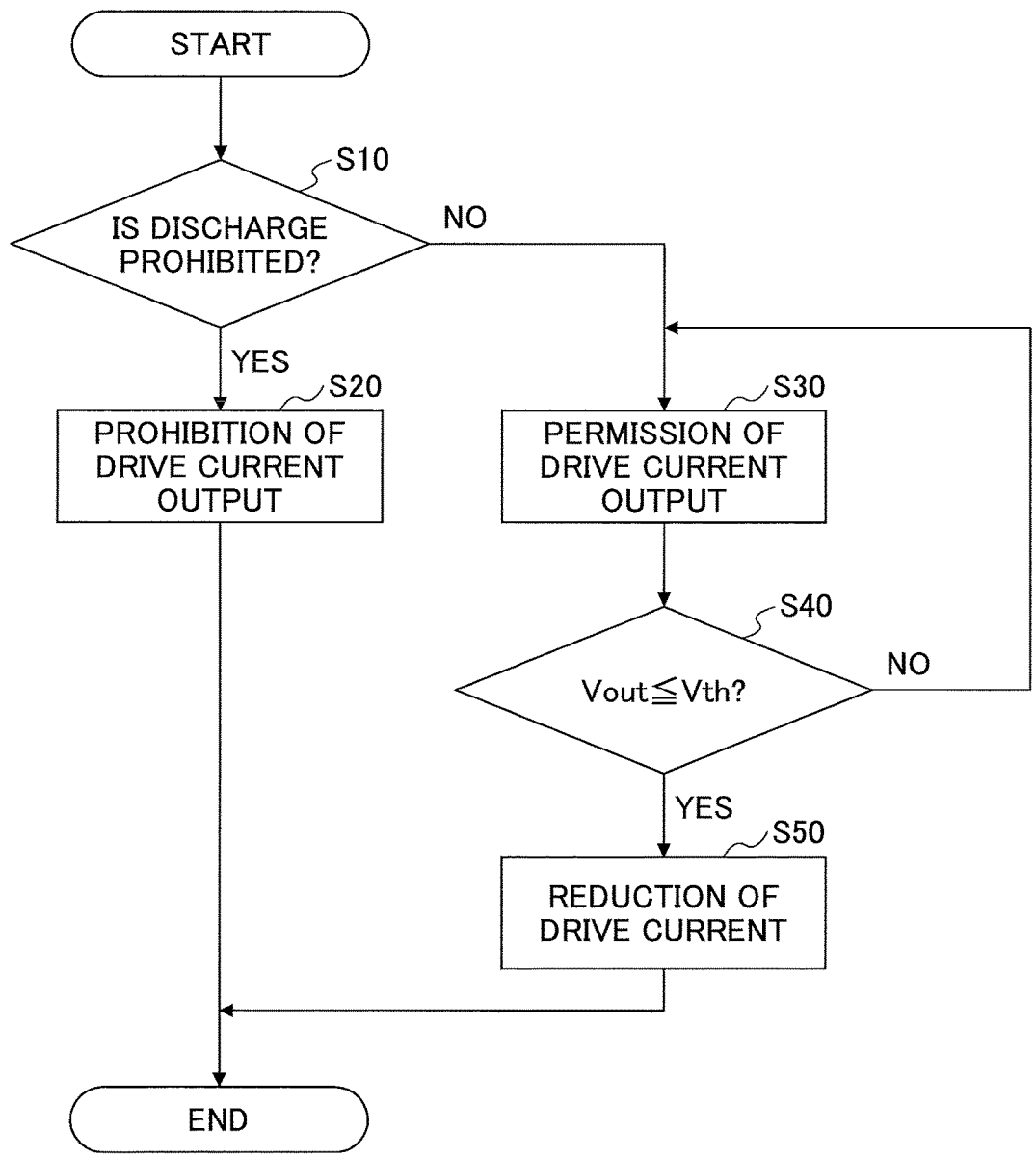
FIG. 3 is a flowchart illustrating an exemplary operation of a discharge control circuit.

The discharge control circuit 70 is an example of a discharge control circuit which causes the current value to decrease down to a current value enabling the discharge circuit 40 to continuously operate in a case where the detection circuit 60 detects that the output voltage Vout reaches the setup voltage by the operation of the discharge circuit 40, FIG. 3 is a flowchart illustrating an exemplary operation of the discharge control circuit 70.

In step S10, the discharge control circuit 70 determines whether the operation of the discharge circuit 40 is prohibited or permitted by referring to the instruction signal 38.

The discharge control circuit 70 prohibits the drive circuit 50 from outputting the drive current I1 in a case where it is determined that the operation of the discharge circuit 40 is prohibited in step S10 (step S20). With this, the discharge circuit 40 is not operated, the electric charge is not extracted (is not discharged) by the discharge circuit 40. Then, the voltage value of the output voltage Vout is controlled to be a constant value by the operation of the control element 20.

The discharge control circuit 70 permits the drive circuit 50 to output the drive current I1 in a case where it is determined that the operation of the discharge circuit 40 is permitted in step S10 (step S30). With this, the discharge circuit 40 is operated by the drive current I1. Therefore, the electric charge is extracted by the discharge circuit 40. Then, the voltage value of the output voltage Vout rapidly decreases so as to approach the ground voltage GND.

In step S40, the discharge control circuit 70 determines whether the detection circuit 60 detects that the output voltage Vout reaches the setup voltage Vth by the discharge operation of the discharge circuit 40. With this, the discharge control circuit 70 determines whether the electric charge on the side of the output terminal 12 of the control element 20 is completely discharged.

The setup voltage Vth is a voltage preset to have a voltage value between the output voltage Vout and the ground voltage GND at a time of the regulation operation of the control element 20. In a case where the output voltage Vout is decreased by the discharge operation of the discharge circuit 40, the setup voltage Vth is set to be a voltage slightly greater than the ground voltage GND.

The discharge control circuit 70 permits the drive circuit 50 to continuously output the drive current I1 in a case where it is determined that the detection circuit 60 does not detect an event where the output voltage Vout reaches the setup voltage Vth by the operation of the discharge circuit 40 in step S40 (step S30). With this, the discharge circuit 40 continuously operates by the drive current I1. Therefore, the discharge operation causing the output voltage Vout to approach the ground voltage GND continues.

On the other hand, the discharge control circuit 70 causes the current value of the drive current I1 to decrease down to the current value enabling the discharge circuit 40 to continuously operate in a case where the detection circuit 60 detects that the output voltage Vout reaches the setup voltage Vth by the operation of the discharge circuit 40 in step S40 (step S50).

As described, in the case where it is detected that the output voltage Vout reaches the setup voltage Vth by the operation of the discharge circuit 40, the current value of the drive current I1 drops to the current value enabling the discharge circuit 40 to continuously operate. Therefore, it is possible to cause the consumption current of the regulator 101 to be in a state where the electric charge of the control element 20 on the side of the output terminal 12 is completely discharged.

Figure 4:
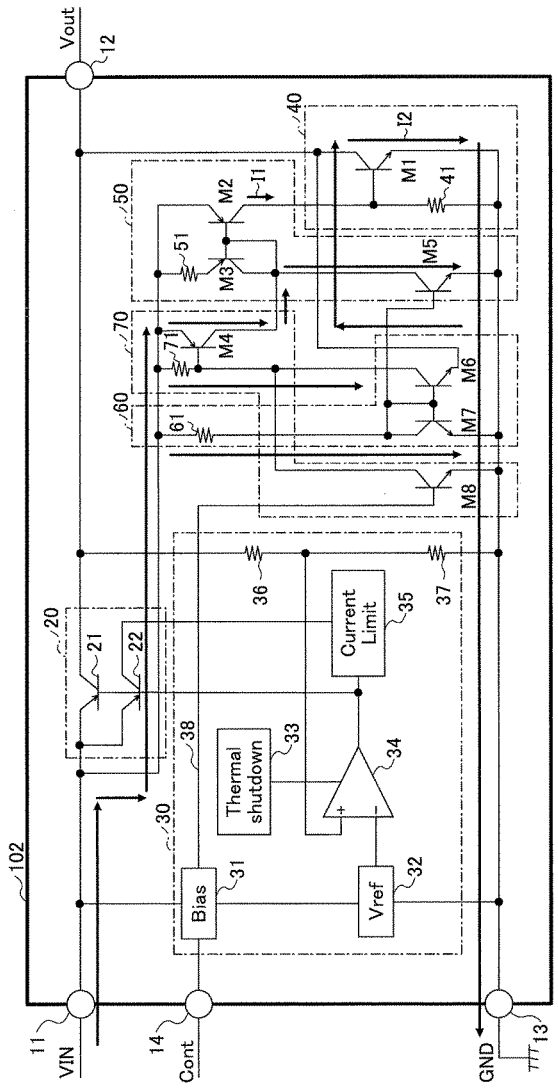
FIG. 4 specifically illustrates a structure of an exemplary power circuit.

FIG. 4 is a block chart illustrating a structural example of a regulator 102 being an embodiment of the power circuit. The description of a structure and an effect similar to those of the regulator 101 is omitted or simplified.

The control element 20 includes a control transistor 21. The control transistor 21 is an example of a control transistor for generating the output voltage Vout obtained by regulating the input voltage VIN. The control transistor 21 is connected between the input terminal 11 and the output terminal 12 in series. The control transistor 21 steps down a positive voltage value (e.g., 5 V) of the input voltage VIN so as to be a constant positive value (e.g., 3 V) lower than the voltage value of the input voltage VIN in response to, for example, a drive signal from an error amplifier 34 of the control circuit 30.

The control transistor 21 is, for example, a PNP bipolar transistor having an emitter connected to the input terminal 11, a collector connected to the output terminal 12, and a base connected to an output point of the error amplifier 34.

The control circuit 30 includes a reference voltage circuit 32, a bias circuit 31, the error amplifier 34, and resistors 36 and 37.

The reference voltage circuit 32 is an example of a circuit generating the reference voltage Vref. The bias circuit 31 is an example of a circuit for supplying a bias current or a bias voltage, which causes the reference voltage circuit 32 and the error amplifier 34 to operate, to the reference voltage circuit 32 and the error amplifier 34. The error amplifier 34 includes an inverted input portion, to which the reference voltage Vref is input, and a non-inverted input portion, to which the detection value of the output voltage Vout is subjected to a feedback input. The detection value of the output voltage Vout is a voltage obtained by dividing, for example, output voltage Vout using the resistors 36 and 37.

The control circuit 30 may include a thermal shutdown circuit 33. The thermal shutdown circuit 33 stops the operation of the control element 20 so as to prevent the regulator 102 from overheating in a case where it is detected that the temperature of the regulator 102 (specifically, the control element 20) is higher than a predetermined temperature.

The control circuit 30 may include a current limiting circuit 35. The current limiting circuit 35 stops the operation of the control element 20 so as to protect the control element 20 from an overcurrent in a case where the sense transistor 22 detects that the current value of a current flowing between the emitter and the collector of the control transistor 21 is greater than a predetermined current value.

The sense transistor 22 is an example of a sense element detecting the current flowing between the emitter and the collector of the control transistor 21. The sense transistor 22 is, for example, a PNP bipolar transistor having an emitter connected to the input terminal 11, a collector connected to the current limiting circuit 35, and a base connected to the output point of the error amplifier 34. The base of the sense transistor 22 and the base of the control transistor 21 are commonly connected to the output point of the error amplifier 34.

The discharge circuit 40 includes a discharge transistor M1 and a resistor 41. The discharge transistor M1 is an example of a discharge transistor for extracting an electric charge of the control transistor 21 on a side of the output terminal 12. For example, the discharge transistor M1 discharges the electric charge in the output terminal 12 to the ground terminal 13. In a case where the capacitor connected to the output terminal 12 is disposed outside the regulator 102, the discharge transistor M1 discharges the electric charge, which is extracted from, for example, the capacitor connected to the output terminal 12 through the output terminal 12 to the ground terminal 13. As described, when the discharge transistor M1 extracts the electric charge on the side of the output terminal 12, the output voltage Vout rapidly decreases so as to approach the ground voltage GND.

The discharge transistor M1 is an NPN bipolar transistor including a base connected to a drive transistor M2 of the drive circuit 50, an emitter grounded to be the ground voltage GND, and a collector connected between the collector of the control transistor 21 and the output terminal 12. The resistor 41 is connected between the base and the emitter of the discharge transistor M1.

The drive circuit 50 includes drive transistors M2 and M3, a resistor 51, and a transistor M5. The drive transistors M2 and M3 are an example of a drive transistor generating the drive current I1 for causing the discharge transistor M1 to operate using the electric power (specifically, the electric power of the input voltage VIN) of the control transistor 21 on the side of the input terminal 11.

The drive transistors M2 and M3 are a current mirror for outputting the drive current I1 using the current flowing through the transistor M5.

The drive transistor M3 on the input side of the drive circuit 50 is a PNP bipolar transistor including an emitter connected to a current path between the input terminal 11 and the emitter of the control transistor 21 through the resistor 51, a collector connected to the collector of the transistor M5, and a base connected between the collector of the transistor M5 and the base of the drive transistor M2 of the drive circuit 50.

The drive transistor M2 on the output side of the drive circuit 50 is a PNP bipolar transistor including an emitter connected to a current path between the input terminal 11 and the emitter of the control transistor 21, a collector connected to the base of the discharge transistor M1 of the discharge circuit 40, and a base connected between the collector of the transistor M5 and the base of the drive transistor M3.

The drive transistor M5 is an NPN bipolar transistor including an emitter connected to the ground voltage GND, a collector connected to the collector of the drive transistor M3, and a base connected to a current path between the input terminal 11 and the emitter of the control transistor 21 through the resistor 61. The transistor M5 is an example of a current source of a current causing the drive transistors M2 and M3 to operate. The transistor may be replaced by a resistor.

The discharge circuit 60 includes detection transistors M6 and M7 and a resistor 61. The detection transistors M6 and M7 are operated by receiving the power of the control element 20 on the side of the input terminal 11 without being operated by receiving the power of the control element 20 on the side of the output terminal 12 so that the detection transistors M6 and M7 are caused to continuously detect the output voltage Vout even if the output voltage approaches the ground voltage GND by the discharge operation of the discharge circuit 40.

The detection transistors M6 and M7 are an example of a detection transistor detecting the output voltage Vout and detect whether the output voltage Vout reaches the setup voltage Vth. The detection transistors M6 and M7 of the detection circuit 60 monitor the collector of the discharge transistor M1 through the emitter of the detection transistor M6. Said differently, the detection transistors M6 and M7 monitor the output voltage Vout through the emitter of the detection transistor M6.

The detection transistor M6 on the output side of the detection circuit 60 is an NPN bipolar transistor including an emitter connected to the collector of the discharge transistor M1, a base grounded through a PN junction between the base and the emitter of the detection transistor M7, and a collector connected to the base of a discharge control transistor M4. The base of the detection transistor M6 is connected to the base and the collector of the detection transistor M7 and also connected to a current path between the input terminal 11 and the emitter of the control transistor 21 through the resistor 61.

The detection transistor M7 on the input side of the detection circuit 60 is an NPN bipolar transistor including an emitter connected to the ground voltage GND, a collector connected to the current path between the input terminal 11 and the emitter of the control transistor 21 through the resistor 61, and a base connected to the collector of the detection transistor M7 and the base of the detection transistor M6.

The discharge control circuit 70 includes discharge control transistors M8 and M4 and the resistor 71.

The discharge control transistor M8 on the input side of the discharge control circuit 70 is an NPN bipolar transistor including an emitter grounded to be the ground voltage GND, a base to which the instruction signal 38 is input, and a collector to which the base of the discharge control transistor M4 is connected. The instruction signal 38 is supplied as the base current of the discharge control transistor M8.

The discharge control transistor M4 is an example of a discharge control transistor which causes the current value of the drive current I1 to decrease to a current value enabling the discharge transistor M1 to continuously operate in a case where the detection transistors M6 and M7 detect an event where the output voltage Vout reaches the setup voltage Vth by the operation of the discharge transistor M1.

The discharge control transistor M4 on the output side of the discharge control circuit 70 is a PNP bipolar transistor including an emitter connected to the current path between the input terminal 11 and the emitter of the control transistor 21, a collector connected to the collector of the drive transistor M3 of the drive circuit 50, and a base connected to the collector of the discharge control transistor M8. The resistor 71 is connected between the base and the emitter of the discharge control transistor M4.

In the regulator 102, when the level of the instruction signal 38 is a high level, the control transistor 21 of the control element 20 performs the regulation operation. Therefore, the operation of the discharge circuit 40 is prohibited. On the other hand, when the level of the instruction signal 38 is a low level, the control transistor 21 of the control element 20 stops the regulation operation. Therefore, the operation of the discharge circuit 40 is permitted.

When the level of the instruction signal 38 is in a high level of instructing to prohibit the operation of the discharge circuit 40, the discharge control transistor M8 is turned on. Therefore, the discharge control transistor M4 is also turned on. When the discharge control transistor M4 is turned on, the voltage between the emitter of the drive transistor M3 and the base of the drive transistor M3 is not ensured. Therefore, the current value of the drive current I1 output from the collector of the drive transistor M2 is substantially zero. Therefore, because the discharge transistor M1 is turned off, the discharge transistor M1 of the discharge circuit 40 stops the discharge operation.

When the level of the instruction signal 38 is in a low level of instructing to permit the operation of the discharge circuit 40, the discharge control transistor M8 is turned off. Therefore, the discharge control transistor M4 is also turned off. When the discharge control transistor M4 is turned off, the voltage between the emitter of the drive transistor M3 and the base of the drive transistor M3 is ensured. Therefore, the current value of the drive current I1 output from the collector of the drive transistor M2 increases to be a value enabling the discharge transistor M1 to operate. Therefore, the discharge transistor M1 performs the discharge operation where a discharge current for discharging the electric charge on the output terminal side is flown between the collector and the emitter of the discharge transistor M1.

When the discharge operation is performed using the discharge transistor M1 of the discharge circuit 40, the output voltage Vout rapidly decreases so as to approach the ground voltage GND. When the decreased output voltage Vout reaches the setup voltage Vth, the detection transistor M6 whose emitter is connected to the collector of the discharge transistor M1 starts to operate so as to increase the collector current of the detection transistor M6. When the collector current of the detection transistor M6 increases, the collector current of the discharge transistor M1 also increases.

The detection transistor M6 and M7 may adjust the base current of the discharge control transistor M4 using the collector current of the detection transistor M6. Therefore, the detection transistors M6 and M7 cause the base current of the discharge control transistor M4 by the increase of the collector current of the detection transistor M6. When the base current of the discharge control transistor M4 increases, the collector current of the discharge control transistor M4 also increases.

The discharge control transistor M4 may adjust the base currents of the drive transistors M2 and M3 using the collector current of the discharge control transistor M4. Therefore, the discharge control transistor M4 causes the base currents of the drive transistors M2 and M3 to decrease by increasing the collector current of the discharge control transistor M4. When the base currents of the drive transistors M2 and M3 decrease, the collector current (said differently, the drive current I1) output from the collector of the drive transistor M3.

The drive transistors M2 and M3 may adjust the base current of the discharge transistor M1 using the collector current output from the collector of the drive transistor M2. Therefore, the base current of the discharge transistor M1 is decreased when the drive transistors M2 and M3 cause the drive current I1 output from the collector of the drive transistor M2 to decrease. When the base current of the discharge transistor M1 decreases the collector current of the discharge transistor M1 decreases.

Said differently, when the collector current of the discharge transistor M1 is to increase by the operation of the detection transistor M6, the base current of the discharge transistor M1 decreases so as to decrease the collector current of the discharge transistor M1. The base of the detection transistor M6 is grounded to be the ground voltage GND through a PN junction between the base and the emitter of the detection transistor M7. Therefore, when the detection transistor M6 whose emitter is connected to the collector of the discharge transistor M1 operates, a voltage (a collector voltage) between the collector and the emitter of the discharge transistor M1 is fixed to a voltage value (for example, 0.01 V) slightly greater than the ground voltage GND.

As described, in a state where the drive current I1 is decreased, a negative feedback operation is maintained by offsetting an increase and a decrease of the corrector current of the discharge transistor M1 so that the collector voltage converges to a voltage value slightly greater than the ground voltage GND. Therefore, it is possible to decrease the consumption current of the regulator 102 as much as the decrease of the drive current I1 in a state where the discharge on the side of the output terminal 12 is completed (said differently, a state where the operation of the control transistor 21 of the control element 20 is stopped).

Further, because the transistors inside the regulator 102 (for example, the control transistor 21, the sense transistor 22, the discharge transistor M1, the drive transistors M2 and M3, the transistor M1, the detection transistors M6 and M7, and the discharge control transistors M4 and M8) are bipolar transistors, a noise generated by the regulator 102 is decreased.

Arrows in FIG. 4 indicate major current flows in the state where the discharge on the side of the output terminal 12 is completed.

Figure 5:
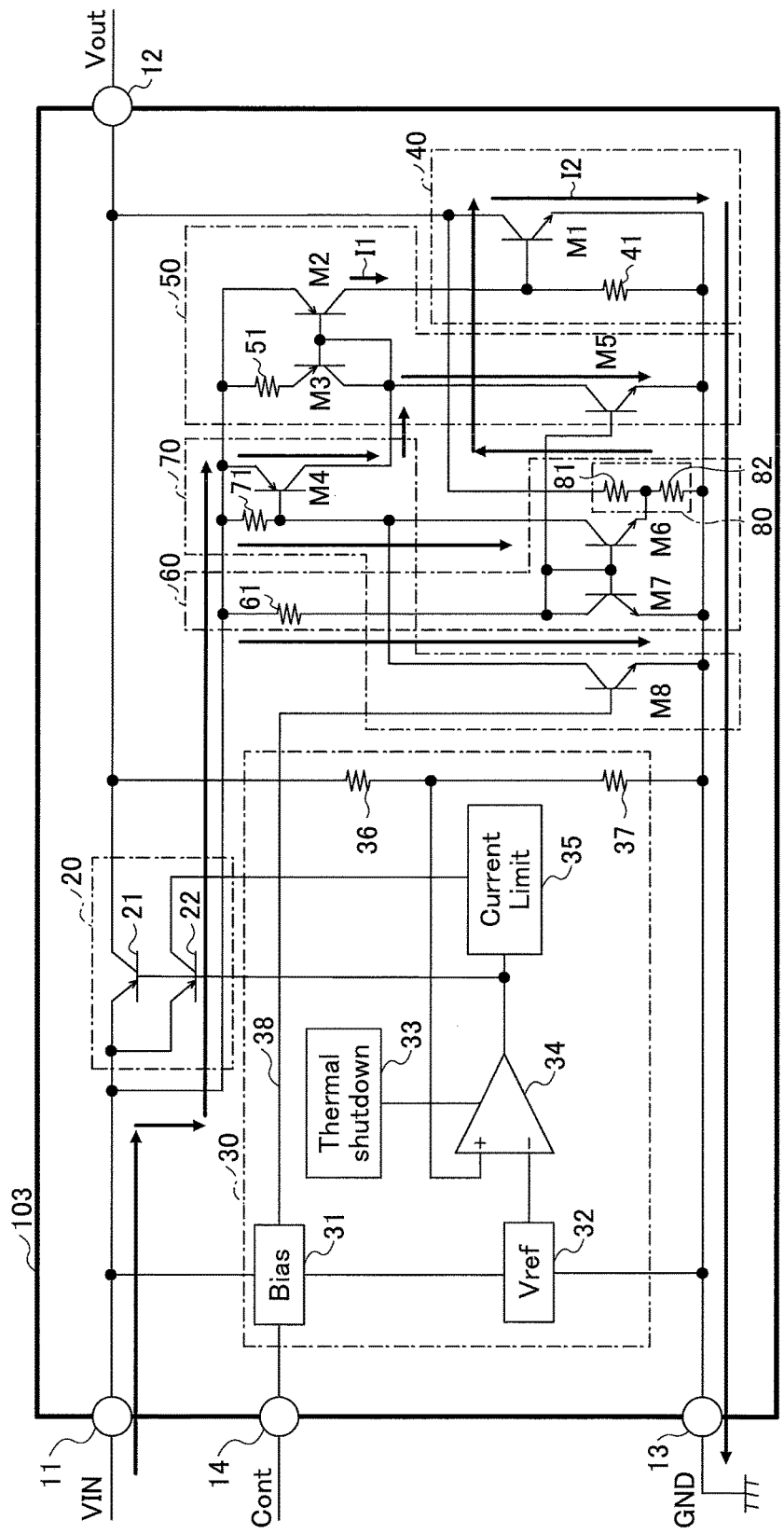
FIG. 5 specifically illustrates a structure of another exemplary power circuit.

FIG. 5 illustrates a structure of an example of a regulator 103 being an embodiment of the power circuit. The description of a structure and an effect similar to those of the regulator 102 is omitted or simplified. Arrows in FIG. 5 indicate major current flows in the state where the discharge on the side of the output terminal 12 is completed. The regulator 103 differs from the regulator 102 at a point where the regulator 103 includes a voltage-dividing circuit 80.

The voltage-dividing circuit 80 is a circuit generating a voltage division value of the output voltage Vout. The voltage-dividing circuit 80 divides the output voltage Vout using a resistor 81 and a resistor 82. A connection point between the resistor 81 and the resistor 82 is connected to the emitter of the detection transistor M6. Said differently, the detection transistors M6 and M7 monitors the voltage division value of the output voltage Vout through the emitter of the detection transistor M6.

By setting the emitter voltage of the detection transistor M6 to the voltage division value of the output voltage Vout as described above, a backward voltage applied between the base and the emitter of the detection transistor M6 may be decreased at a time of the regulation operation of the control transistor 21 of the control element 20. With this, degradation of the detection transistor M6 may be prevented.

By setting the emitter voltage of the detection transistor M6 to the voltage division value of the output voltage Vout, the output voltage Vout may be increased in a state (a discharge completion state) where the discharge on the side of the output terminal 12 is completed. Therefore, in a case where the discharge completion state is canceled so that the control transistor 21 of the control element 20 starts to perform the regulation operation, the output voltage Vout may be rapidly increased, and a rush current of a capacitor connected to the output terminal 12 may be decreased.

Figure 6:
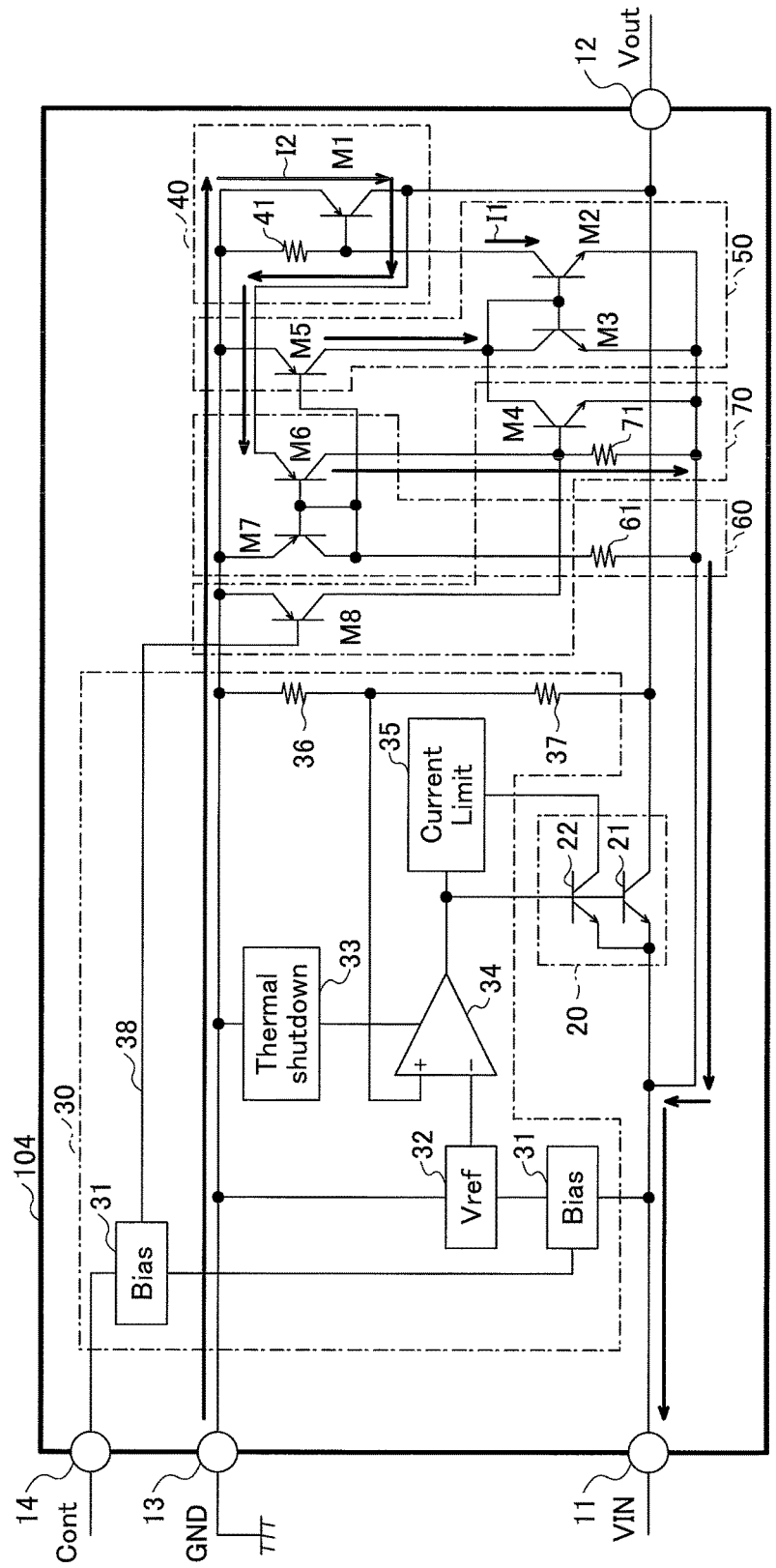
FIG. 6 specifically illustrates a structure of another exemplary power circuit.

FIG. 6 illustrates a structure of an example of a regulator 104 being an embodiment of the power circuit. The description of a structure and an effect similar to those of the regulators 102 and 103 is omitted or simplified. Arrows in FIG. 6 indicate major current flows in the state where the discharge on the side of the output terminal 12 is completed.

The regulators 102 and 103 are a positive voltage series regulator which generates a direct-current positive output voltage Vout using a direct-current positive input voltage VIN by the control transistor 21 of the control element 20 and outputs the direct-current positive output voltage Vout. The regulator 104 is a negative voltage series regulator which generates a direct-current negative output voltage Vout using a direct-current negative input voltage VIN by the control transistor 21 of the control element 20 and outputs the direct-current positive output voltage Vout.

The negative voltage series regulator is structured by replacing the NPN bipolar transistor of the positive voltage series regulator with a PNP bipolar transistor and replacing the PNP bipolar transistor of the positive voltage series regulator with a NPN bipolar transistor.

For example, the PNP control transistor 21 in FIGS. 4-5 is replaced by a NPN control transistor 21 in FIG. 6. As illustrated in the figures, the other transistors are replaced in a manner similar thereto. Further, transistors (not illustrated) forming a circuit inside the control circuit 30 are replaced in a manner similar thereto.

The control transistor 21 of the control element steps up a negative voltage value (e.g., −5 V) of the input voltage VIN so as to be a constant positive value (e.g., −3 V) higher than the voltage value of the input voltage VIN in response to, for example, a drive signal from the error amplifier 34 of the control circuit 30. The control transistor 21 is, for example, a NPN bipolar transistor having an emitter connected to the input terminal 11, a collector connected to the output terminal 12, and a base connected to the output point of the error amplifier 34.

The discharge circuit 40 includes the discharge transistor M1 and the resistor 41. The discharge transistor M1 is an example of a discharge transistor for extracting an electric charge of the control transistor 21 on a side of the output terminal 12. For example, the discharge transistor M1 discharges the electric charge in the output terminal 12 to the ground terminal 13. In a case where the capacitor connected to the output terminal 12 is disposed outside the regulator 102, the discharge transistor M1 discharges the electric charge, which is extracted from, for example, the capacitor connected to the output terminal 12 through the output terminal 12 to the ground terminal 13. As described, when the discharge transistor M1 extracts the electric charge on the side of the output terminal 12, the output voltage Vout rapidly increases so as to approach the ground voltage GND.

Therefore, also in a case of the regulator 104, it is possible to decrease the consumption current of the regulator 102 as much as the decrease of the drive current I1 in a state where the discharge on the side of the output terminal 12 is completed (said differently, a state where the operation of the control transistor 21 of the control element 20 is stopped).

At a time of the regulation operation in the control transistor 21 of the control element 20, a backward voltage is applied between the base and the emitter of the detection transistor M6. However, by using, for example, a lateral PNP bipolar transistor having a relatively high withstanding voltage between the base and the emitter as the detection transistor M6, a setup value of the negative output voltage Vout at t0 time of the regulation operation may be decreased to be a further lower negative voltage value.

Described next is a simulation result of the consumption current of the regulator 102 illustrated in FIG. 4 in the state (the discharge completion state) where the discharge on the side of the output terminal 12 is completed. An effect of decreasing the consumption current of the regulator 102 is described while setting the regulator 100 illustrated in FIG. 7 as a comparative example.

Figure 7:
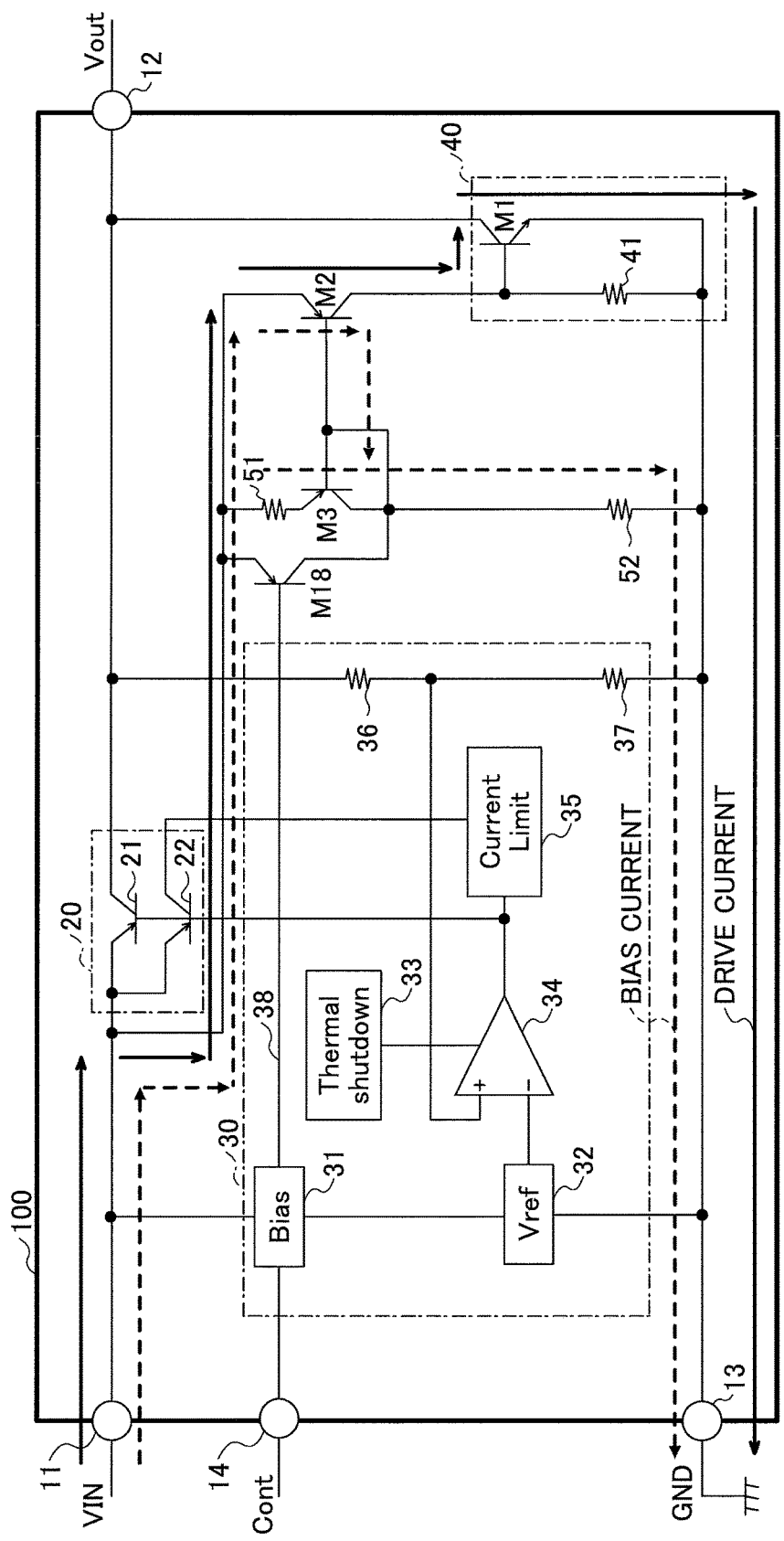
FIG. 7 illustrates a structure of a comparative example of a power circuit.

FIG. 7 illustrates a structure of a regulator 100 being a comparative example of a power circuit. The description of a structure and an effect similar to those of the regulators 102 and 103 is omitted or simplified. Arrows illustrated in FIG. 7 indicate major current flows in the discharge completion state.

The regulator 100 illustrated in FIG. 7 is an example of a series regulator which generates the direct-current positive output voltage Vout using the direct-current positive input voltage VIN by the control transistor 21 of the control element 20. In the regulator 100, when the level of the instruction signal 38 is a low level, the control transistor 21 of the control element 20 performs the regulation operation. Therefore, the operation of the discharge circuit 40 is prohibited. On the other hand, when the level of the instruction signal 38 is a high level, the control transistor 21 of the control element 20 stops the regulation operation. Therefore, the operation of the discharge circuit 40 is permitted.

When the level of the instruction signal 38 is the low level of instructing to prohibit the operation of the discharge circuit 40, the discharge control transistor M18 is turned on. When the discharge control transistor M18 is turned on, the voltage between the emitter of the drive transistor M3 and the base of the drive transistor M3 is not secured. Therefore, the current value of the drive current I1 output from the collector of the drive transistor M2 is substantially zero. Therefore, because the discharge transistor M1 is turned off, the discharge transistor M1 of the discharge circuit 40 stops the discharge operation.

When the level of the instruction signal 38 is the high level of instructing to permit the operation of the discharge circuit 40, the discharge control transistor M18 is turned off. When the discharge control transistor M18 is turned off, the voltage between the emitter of the drive transistor M3 and the base of the drive transistor M3 is secured. Therefore, the current value of the drive current I1 output from the collector of the drive transistor M2 increases to be a value enabling the discharge transistor M1 to operate. Therefore, the discharge transistor M1 performs the discharge operation where the discharge current for discharging the electric charge on the output terminal side is flown between the collector and the emitter of the discharge transistor M1. When the discharge operation is performed using the discharge transistor M1 of the discharge circuit 40, the output voltage Vout rapidly decreases so as to approach the ground voltage GND.

Figure 8:
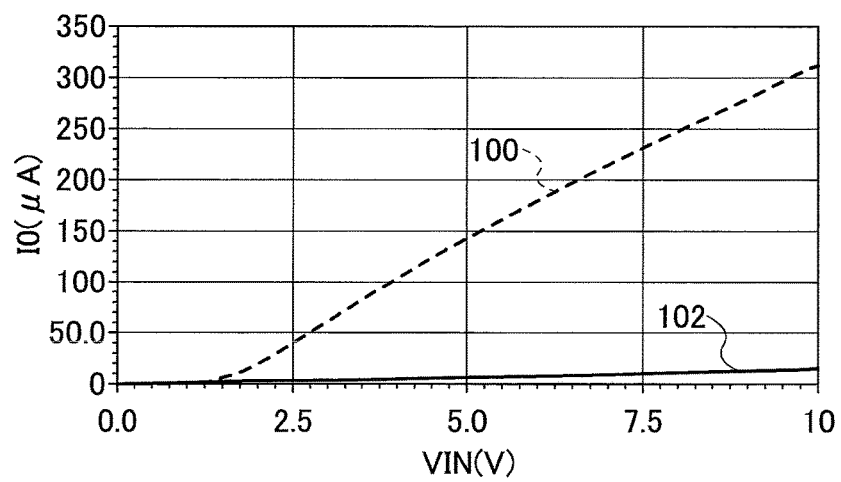
FIG. 8 illustrates an example of a simulation result of a consumption current of the power circuit in a discharge completion state where a discharge on a side of an output terminal is completed.

FIG. 8 illustrates an example of a simulation result indicative of a relationship between the input voltage VIN and a consumption current I0 in the discharge completion state. The consumption current I0 corresponds to a current flowing from the input terminal 11 to the ground terminal 13.

In the case of the regulator 100, when the discharge is completed, not only the drive current for driving the discharge transistor M1 but also a bias current for generating the drive current continuously flows through the path in FIG. 7. Therefore, as illustrated in FIG. 8, the consumption current I0 increases as the input voltage VIN increases.

Meanwhile, in the case of the regulator 102 illustrated in FIG. 4, when the discharge is completed, although the current continuously flows through the path in FIG. 4, the drive current I1 decreases. Therefore, as illustrated in FIG. 8, the increase of the consumption current I0 may be prevented when the input voltage VIN increases.

Figure 9:
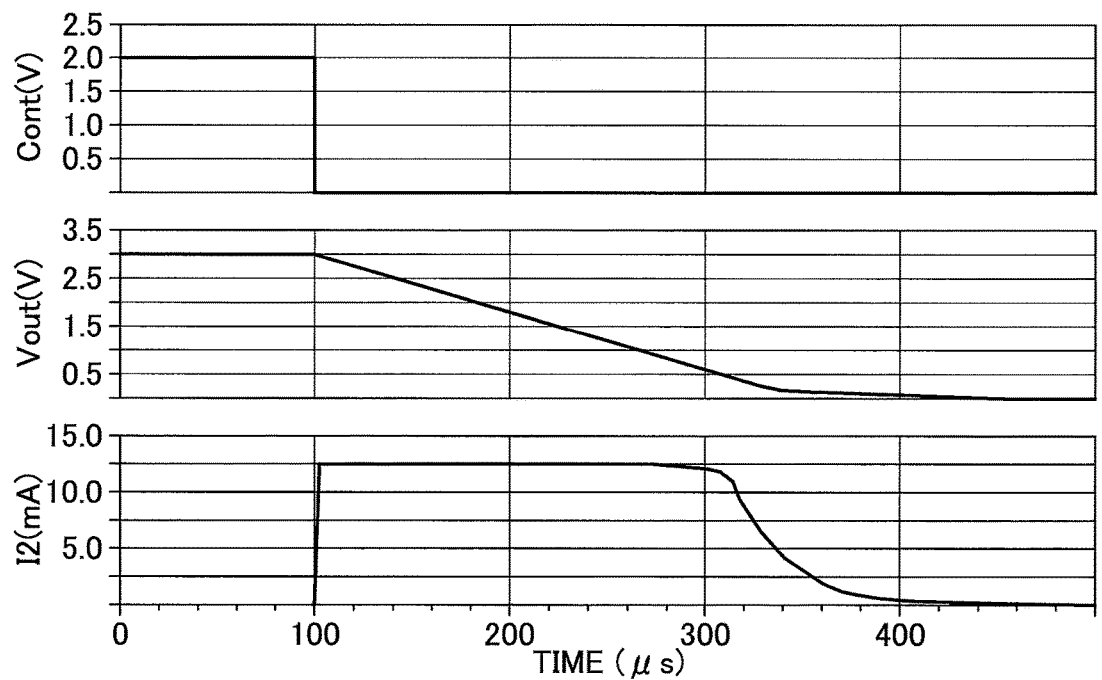
FIG. 9 illustrates an exemplary simulation result indicative of a relationship between an output voltage and a discharge current.

FIG. 9 illustrates an example of a simulation result indicative of a relationship between the output voltage Vout and the discharge current I2 in the regulator 102 illustrated in FIG. 4. The discharge current I2 corresponds to a current flowing from the output terminal 12 through the discharge transistor M1 to the ground terminal 13.

When the control signal changes from the high level to the low level, the discharge circuit 40 starts to operate. When the discharge circuit 40 starts to operate, the discharge current I2 starts to flow. Therefore, it is illustrated that the output voltage Vout rapidly decreases. Further, because the detection transistor M6 includes the base grounded to be the ground voltage GND through the PN junction of the detection transistor M7 and the emitter connected to the collector of the discharge transistor M1, the collector voltage (said differently, the output voltage Vout) of the discharge transistor M1 may approach the ground voltage GND without limit.

Figure 10:
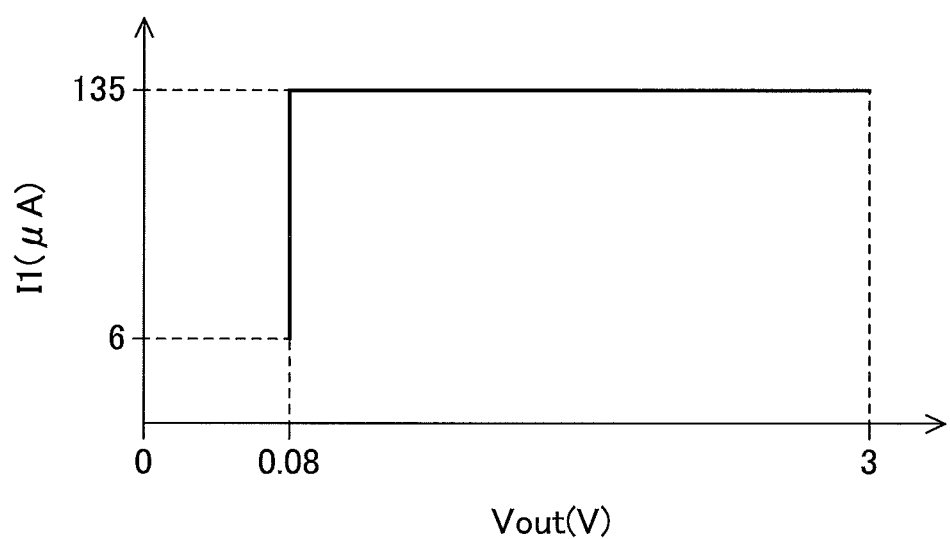
FIG. 10 illustrates an exemplary relationship between the output voltage and a drive current.

FIG. 10 illustrates an exemplary relationship between the output voltage Vout and the drive current I1 when the voltage value of the input voltage Vin is 5 V. During the regulation operation of the control transistor 21, the voltage value of the output voltage Vout is about 3 V and the current value of the drive current I1 is about 135 µA. Until the voltage value of the output voltage Vout decreases to reach the voltage value of the setup voltage Vth of 0.08 V, the current value of the drive current I1 is maintained to be about 135 µA. After the voltage value of the output voltage Vout decreases to reach the voltage value of the setup voltage Vth of 0.08 V, the current value of the drive current I1 rapidly decreases to a current value (about 6 µA) in which the discharge circuit 40 is enabled to continuously operate. With this, the consumption current of the regulator 102 may be decreased in a state where the electric charge of the control transistor 21 on the side of the output terminal 12 is completely discharged.

Although the power circuit is described within the embodiments as described above, the present invention is not limited to the above embodiments. Within a scope of the present invention, various modifications and alternations such as a combination and a substitution of a part or all of the other embodiment are possible.

For example, the transistor used for the power circuit is not limited to the bipolar transistor but may be another transistor such as MOSFET. Further, the power circuit is not limited to a series regulator but may be a switching regulator.

Further, the same function as that of the voltage-dividing circuit 80 may be added to the negative voltage series regulator as illustrated in FIG. 5.

According to the embodiment, the consumption current of the power circuit may be decreased in a state where the side of the output terminal is completely discharged.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the power circuit has been described in detail, it should be understood that the various changes, substitutions, and alterations could be made hereto without departing from the spirit and scope of the invention.

What is claimed is:

1. A power circuit comprising:
an input terminal to which an input voltage is applied;
a control element which generates an output voltage obtained by regulating the input voltage;
an output terminal from which the output voltage is output;
a discharge circuit which discharges by extracting an electric charge from the control element on a side of the output terminal;
a drive circuit which generates a drive current for causing the discharge circuit to operate using power of the control element on the side of the input terminal;
a detection circuit which detects the output voltage; and
a discharge control circuit which decreases a current value of the drive current to a current value enabling the discharge circuit to continuously operate in a case where the detection circuit detects that the output voltage reaches a setup voltage by an operation of the discharge circuit.

2. The power circuit according to claim 1,
wherein the discharge circuit includes a discharge transistor driven by the drive current, and
wherein the detection circuit monitors a collector of the discharge transistor.

3. The power circuit according to claim 1,
wherein the detection circuit includes a detection transistor for detecting whether the output voltage reaches the setup voltage.

4. The power circuit according to claim 3,
wherein the detection transistor includes a base grounded through a PN junction.

5. The power circuit according to claim 3,
wherein the detection transistor monitors a voltage division value of the output voltage.

6. The power circuit according to claim 1,
wherein the detection transistor monitors the output voltage through the emitter of the detection transistor.

7. The power circuit according to claim 1,
wherein the output voltage is a negative voltage.

8. A power circuit comprising:
an input terminal to which an input voltage is applied;
a control transistor which generates an output voltage obtained by regulating the input voltage;
an output terminal from which the output voltage is output;
a discharge transistor which discharges by extracting an electric charge from the control transistor on a side of the output terminal;
a drive transistor which generates a drive current for causing the discharge transistor to operate using power of the control transistor on the side of the input terminal;
a detection transistor which detects the output voltage; and
a discharge control transistor which decreases a current value of the drive current to a current value enabling the discharge transistor to continuously operate in a case where the detection transistor detects that the output voltage reaches a setup voltage by an operation of the discharge transistor.

9. The power circuit according to claim 8,
wherein a collector of the discharge transistor is connected to an emitter of the detection transistor,
wherein the detection transistor adjusts a base current of the discharge control transistor,
wherein the discharge control transistor adjusts a base current of the drive transistor,
wherein the drive transistor adjusts a base current of the discharge transistor.

10. The power circuit according to claim 8,
wherein the control transistor, the discharge transistor, the drive transistor, the detection transistor, and the discharge control transistor are a bipolar transistor.

11. The power circuit according to claim 8,
wherein the detection transistor includes a base grounded through a PN junction.

12. The power circuit according to claim 8,
wherein the detection transistor monitors a voltage division value of the output voltage.

13. The power circuit according to claim 8,
wherein the output voltage is a negative voltage.

* * * * *